US009800086B2

United States Patent
Shiraishi et al.

(10) Patent No.: US 9,800,086 B2
(45) Date of Patent: Oct. 24, 2017

(54) ELECTRIC STORAGE DEVICE MANAGEMENT SYSTEM, ELECTRIC STORAGE DEVICE PACK, AND METHOD OF ESTIMATING STATE OF CHARGE

(71) Applicant: GS Yuasa International Ltd., Kyoto-shi (JP)

(72) Inventors: Takeyuki Shiraishi, Kyoto (JP); Takeshi Itagaki, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/216,240

(22) Filed: Jul. 21, 2016

(65) Prior Publication Data

US 2016/0329738 A1 Nov. 10, 2016

Related U.S. Application Data

(63) Continuation of application No. 13/888,213, filed on May 6, 2013, now Pat. No. 9,429,626.

(30) Foreign Application Priority Data

May 10, 2012 (JP) .................. 2012-108385
Mar. 15, 2013 (JP) .................. 2013-053889
Apr. 11, 2013 (JP) .................. 2013-082992

(51) Int. Cl.
*G01N 27/416* (2006.01)
*H02J 7/35* (2006.01)
(Continued)

(52) U.S. Cl.
CPC .............. *H02J 7/35* (2013.01); *G01R 31/362* (2013.01); *G01R 31/3606* (2013.01);
(Continued)

(58) Field of Classification Search
USPC ......................................... 324/426; 320/132
See application file for complete search history.

(56) References Cited

U.S. PATENT DOCUMENTS 7,679,329 B2    3/2010  Lim et al.
2007/0145948 A1* 6/2007  Lim .................... B60L 11/1887
                                                320/132
(Continued)

FOREIGN PATENT DOCUMENTS

CN    101971043 A    2/2011
JP    2006-351418 A   12/2006
(Continued)

OTHER PUBLICATIONS

Japanese Office Action dated Dec. 6, 2016, with an English translation.

*Primary Examiner* — Robert Grant
(74) *Attorney, Agent, or Firm* — McGinn IP Law Group, PLLC

(57) ABSTRACT

An electric storage device management system includes a voltage sensor configured to detect a voltage across an electric storage device having a correlation between an open circuit voltage (OCV) and a state of charge (SOC), the correlation including a slight change region and a sharp change region, the slight change region being a region in which a variation in OCV relative to the SOC is equal to or smaller than a reference value, and the sharp change region being a region in which the variation is larger than the reference value.

15 Claims, 5 Drawing Sheets

(51) Int. Cl.
 *G01R 31/36* (2006.01)
 *H02J 7/00* (2006.01)
 *B60L 11/18* (2006.01)

(52) U.S. Cl.
 CPC ............ *H02J 7/007* (2013.01); *H02J 7/0081* (2013.01); *B60L 11/1857* (2013.01); *G01R 31/3655* (2013.01); *Y02T 10/705* (2013.01); *Y02T 10/7005* (2013.01)

(56) References Cited

U.S. PATENT DOCUMENTS

| | | | |
|---|---|---|---|
| 2009/0123813 A1* | 5/2009 | Chiang | .................. C01B 25/45 429/50 |
| 2010/0280777 A1 | 11/2010 | Jin et al. | |
| 2010/0283471 A1 | 11/2010 | Lim et al. | |
| 2011/0311850 A1 | 12/2011 | Ashida | |

FOREIGN PATENT DOCUMENTS

| | | |
|---|---|---|
| JP | 2007-171205 A | 7/2007 |
| JP | 2012-002660 A | 1/2012 |

* cited by examiner

ELECTRIC STORAGE DEVICE MANAGEMENT SYSTEM, ELECTRIC STORAGE DEVICE PACK, AND METHOD OF ESTIMATING STATE OF CHARGE

RELATED APPLICATIONS

This application is a Continuation application of U.S. patent application Ser. No. 13/888,213, filed on May 6, 2013.

CROSS-REFERENCE TO RELATED APPLICATIONS

This application claims priority from Japanese Patent Applications No. 2012-108385 filed on May 10, 2012, No. 2013-053889 filed on Mar. 15, 2013, and No. 2013-082992 filed on Apr. 11, 2013.

FIELD

The present invention described in this specification relates to a technology for estimating a state of charge (SOC), or a remaining capacity, of an electric storage device.

BACKGROUND

Conventionally, a method for estimating an SOC using an open circuit voltage (OCV) of a cell has been known as an example of a method for estimating an SOC of an electric storage device. In this method, the OCV of the cell is defined, an SOC corresponding to the defined OCV is determined with reference to a predetermined correlation between OCV and SOC, and the determined SOC is determined as an estimated SOC (see Patent Document 1).
Patent Document 1: JP-A-2007-171205

In some electric storage devices, the correlation between OCV and SOC may not be directly proportional but curved. In such electric storage devices, when SOCs are obtained by the method for estimating an SOC using an OCV, a range of errors in SOC relative to errors in defined OCV varies according to the defined OCV. Especially, if the electric storage devices include an electrode that is made of material having OCV-SOC characteristic in that a slight change region extensively exists, a difference between an SOC obtained by the method of estimating an SOC using an OCV and an actual SOC may become large. The slight change region is a region in which a variation in OCV relative to an SOC is small.

An objective of the present invention is to provide a technology for suppressing determination of an SOC obtained by the method of estimating an SOC using an OCV as an estimated SOC even though the obtained SOC is significantly different from an actual SOC.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

An electric storage device management system described herein includes a voltage sensor, a memory, and a controller. The voltage sensor is configured to detect a voltage across an electric storage device having a correlation between an open circuit voltage (OCV) relative to a state of charge (SOC) includes a slight change region and a sharp change region. The slight change region is a region in which a variation in OCV relative to the SOC is equal to or smaller than a reference value. The sharp change region is a region in which the variation is larger than the reference value. The memory stores at least information on correlation between OCV and SOC in the sharp change region. The controller is configured to: define an OCV of the electric storage device based on a voltage detected by the voltage sensor; determine whether the defined OCV is within the sharp change region; determine an SOC corresponding to the defined OCV based on the information stored in the memory if the defined OCV is within the sharp change region; determine the determined SOC corresponding to the defined OCV as an estimated SOC; and prohibit the determining of the SOC corresponding to the defined OCV as an estimated SOC if the defined OCV is out of the sharp change region.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Overview of this Embodiment

Figure 1:
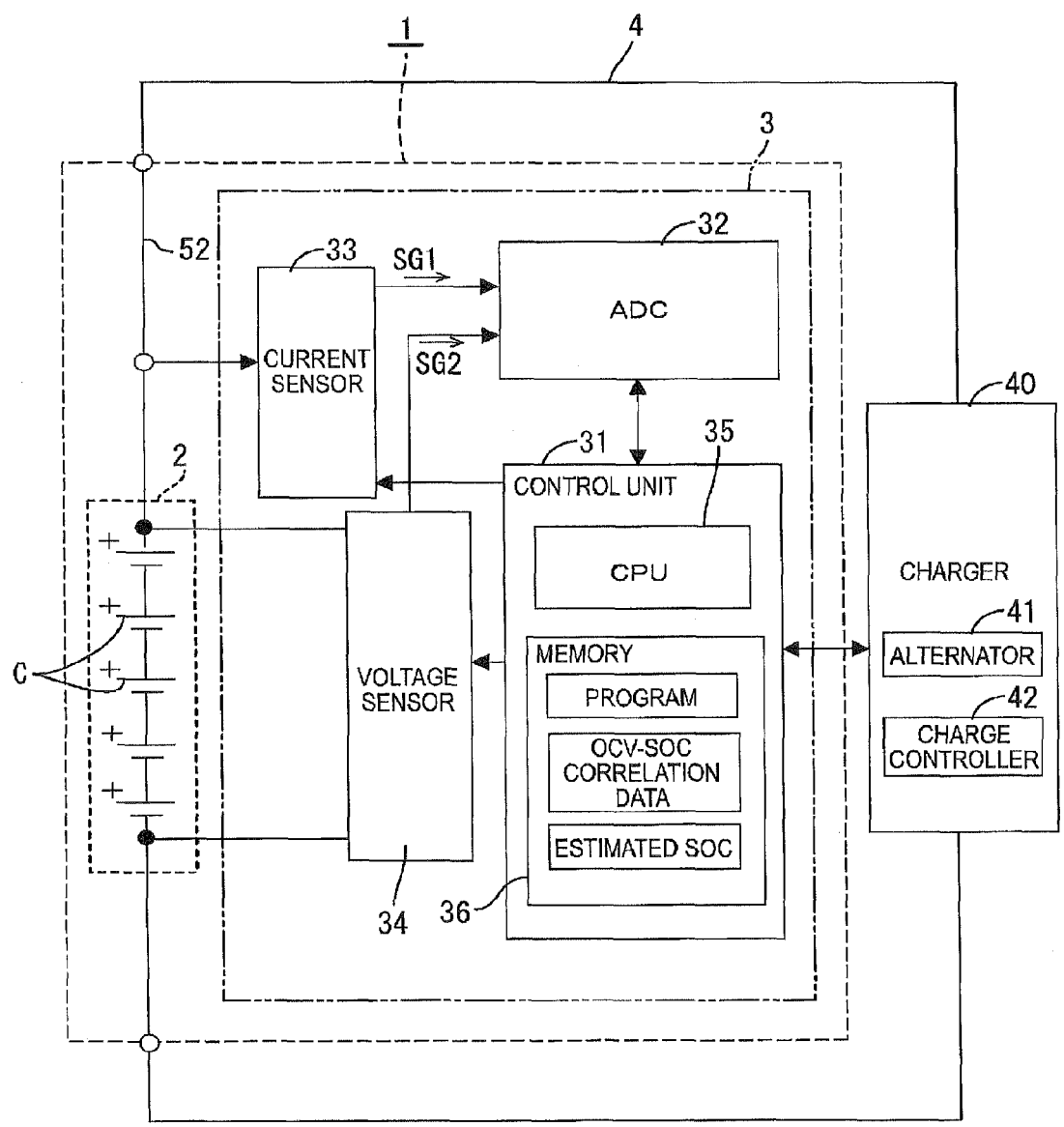
FIG. 1 is a schematic view illustrating a configuration of a battery pack according to an embodiment.

In a correlation between OCV and SOC of the present electric storage device that is to be under the management of an electric storage device management system, a slight change region and a sharp change region exist. In the slight change region, a change in OCV relative to the SOC is equal to or smaller than a reference value. In the sharp change region, the change is larger than the reference value. According to a configuration of this embodiment, if it is determined that the defined OCV is within the sharp change region, the SOC corresponding to the defined OCV is determined as an estimated SOC based on information on the correlation between the OCV in the sharp change region and the SOC. If it is determined that the defined OCV is out of the sharp change region, the determining of the SOC corresponding to the defined OCV as an estimated SOC is prohibited. With this configuration, determination of an SOC obtained by the method of estimating an SOC using an OCV as an estimated SOC even though the obtained SOC is significantly different from an actual SOC can be suppressed.

OCVs in the sharp change region are within a rated voltage range of the electric storage device. Therefore, SOCs corresponding to defined OCVs can be estimated while the electric storage device is used in a normal condition.

If it is determined that a charger is in a charge enable condition in which the charger can charge the electric storage device, the electric storage device management system controls the charger to execute charging operation to maintain an SOC estimated in the SOC estimation process equal to or higher than the minimum value of the SOC in the sharp change region. If the charger is in chargeable unable condition in which the charger cannot charge the electric storage device and the SOC of the electric storage device is lower than the minimum value in the sharp change region, the electric storage device management system may be left as it is while the charger is in the charge unable condition even through the difference between the estimated SOC and the actual SOC is present. With the configuration described above, such a problem is less likely to occur.

If it is determined that a charger is in a chargeable condition, the electric storage device management system controls the charger to execute charging operation to maintain an SOC estimated in the SOC estimation process equal to or lower than the maximum value of the SOC in the sharp change region. If the charger is in the charge unable condition and the SOC of the electric storage device exceeds the maximum valued in the sharp change region, the SOC of the electric storage device further increases because of another charger. Therefore, the electric storage device management system may be left as it is while the charger is in the charge unable condition even through the difference between the estimated SOC and the actual SOC is present. With the configuration described above, such a problem is less likely to occur.

The correlation between OCV and SOC varies depending on a previous status of use of the electric storage device prior to the defined OCV, i.e., whether the electric storage device is in a charge state or a discharge state. Two different voltages may be defined for the same SOC. A large difference may be present between the estimated SOC and the actual SOC in a certain condition. According to the configuration of this embodiment, information stored in memory is information on the correlation between a specific OCV and a corresponding SOC in a region where both sharp change region of the correlation of the secondary battery in the charge state and sharp change region of the correlation of the secondary battery in the discharge state exist. In such sharp change regions, the differences between SOCs in the charge state and the discharge state for the same OCV are relatively smaller than the differences in other regions. Therefore, an SOC corresponding to a defined OCV can be estimated using a single piece of the information for the charge state and the discharge state without determining whether the previous status prior to the OCV defining is the charge state or the discharge state.

According to this electric storage device management system, an SOC is estimated based on a variation of the electric storage device different from an OCV if it is determined that the defined OCV is out of the sharp change region. If it is determined that the defined OCV is within the sharp change region, an SOC corresponding to the defined OCV is determined as an estimated SOC based on the information on the correlation between the OCV in the sharp change region and the SOC. With this configuration, determination of an SOC based on an OCV in the slight change region is suppressed and a difference between the estimated SOC and the actual SOC can be suppressed.

Furthermore, the estimated SOC calculated in the SOC integration process is shifted to an SOC corresponding to the defined OCV based on the correlation between OCV and SOC. In comparison to a configuration in which the estimated SOC is shifted to an SOC corresponding to the defined OCV based on the correlation between OCV and SOC, the difference between the estimated SOC and the actual SOC is less likely to increase from the difference therebetween before the shift even if the defined OCV is within the slight change region.

An embodiment will be described with reference to FIGS. 1 to 5.

A battery pack 1 according to this embodiment is installed in an electric vehicle or a hybrid vehicle, for example, to supply power to electric powered devices that operate with electric energy. In the following description, a hybrid vehicle is used an example.

Configurations of Battery Pack

As illustrated in FIG. 1, the battery pack 1 includes an assembled battery 2 and a battery management system (hereinafter referred to as the BMS) 3. The battery management system is an example of an electric storage device management system. The assembled battery 2 is an example of an electric storage device or a secondary battery. The assembled battery 2 includes a plurality of cells C connected in series. Each cell C is a rechargeable secondary battery, more specifically, an iron phosphate lithium ion battery including a negative electrode made of graphite material.

A charger 40 is arranged inside or outside the hybrid vehicle. The assembled battery 2 is electrically connected to the charger 40 or a load (not illustrated) via wiring 4. The load may be a power source installed in the hybrid vehicle. The charger 40 includes an alternator 41, which is an example of a power generator, and a charge controller 42. The assembled battery 2 is charged with power supplied by the alternator 41. The charge controller 42 may be an engine control unit configured to increase or decrease a power output of the alternator 41.

The BMS 3 includes a control unit 31, an analog to digital converter (hereinafter referred to as ADC) 32, a current sensor 33, and a voltage sensor 34. The control unit 31 includes a central processing unit (hereinafter referred to as the CPU) 35 and a memory 36 such as a ROM or a RAM. The memory 36 stores various programs for controlling operations of the BMS 3 (including an electric storage device management program). The CPU 35 controls components of the battery pack 1 according to the programs read out of the memory 36. For example, the CPU 35 executes a battery management process, which will be described later. The control unit 31 is an example of a controller.

The current sensor 33 detects a current value I of a charge current or a discharge current (hereinafter referred to as the charge/discharge current), which flows through the assembled battery 2 via the wiring 4. The current sensor 33 sends an analog detection signal SG1 corresponding to the detected current value I (A) to the ADC 32. The voltage sensor 34 is connected across the assembled battery 2. The voltage sensor detects a voltage value V (V) across the assembled battery 2 and sends an analog detection signal SG2 corresponding to the detected voltage value V to the ADC 32. The voltage sensor 34 is connected across the assembled battery 2 without the wiring 4 and configured to directly detect the voltage across the assembled battery 2. Therefore, an accurate voltage value V can be detected with reduced influence of resistance of the wiring 4.

The ADC 32 converts the analog detection signals SG1 and SG2 sent from the current sensor 33 and the voltage sensor to digital signals. The ADC 32 writes digital data indicating the current value I and the voltage value V on the memory 36. The charger 40 further includes an operation portion for receiving inputs from a user (not illustrated) and a display including a liquid crystal display for displaying a degree of deterioration of the assembled battery 2 (not illustrated).

The Method for Estimating an SOC Using an OCV and the Method for Estimating an SOC Using Current Integration The method for estimating an SOC using an OCV is a method for estimating an SOC of an electric storage device by defining an OCV of a cell and estimating an SOC corresponding the defined OCV with reference to predefined correlation between OCV and SOC. The method for estimating an SOC using current integration is a method for determining an estimated SOC by defining an OCV at the beginning, calculating an initial SOC based on the defined OCV, obtaining an integrated SOC by integrating charge/discharge currents of the cell, adding the integrated SOC to the initial SOC, and determining the added SOC as an estimated SOC.

OCVs are not accurately defined in many cases. In a case of an electric vehicle or a hybrid vehicle in which a secondary battery is installed, the vehicle does not enter a condition in which no current flows, or a no-load condition, once the vehicle has started driving even when the vehicle stops at light. Namely, a current flows through the secondary battery and thus the OCVs may not be accurately defined. In the method for estimating an SOC using an OCV, an OCV needs to be defined every time an SOC is estimated. On the other hand, in the method for estimating an SOC using current integration, defining of OCVs is not required for each time an SOC is estimated although an OCV needs to be defined at first. The method for estimating an SOC using current integration is more advantageous than the method for estimating an SOC using an OCV in that error in defining of OCV is less likely to affect the estimation and thus a variation in SOC can be accurately defined.

In the method for estimating SOC using current integration, differences between estimated SOCs and actual SOCs due to measurement errors caused by the current sensor, for example, are integrated. Therefore, a difference between the estimated SOC and the actual SOC becomes large if the current integration is executed for a long period. In a certain condition of use of the cell, the method for estimating an SOC using an OCV is more advantageous than the method for estimating an SOC using current integration in that differences between estimated SOCs and actual SOCs are not integrated.

The BMS 3 uses an estimation method that is a combination of methods for estimating an SOC using current integration and for estimating an SOC using an OCV as described later. Specifically, the estimation method is a method for estimating an SOC normally using current integration and shifting the estimated SOC to an SOC obtained by the method for estimating an SOC using an OCV at predetermined timing. With this method, an integration error in SOC due to current integration can be reduced.

OCV-SOC Curve of Assembled Battery

Figure 2:
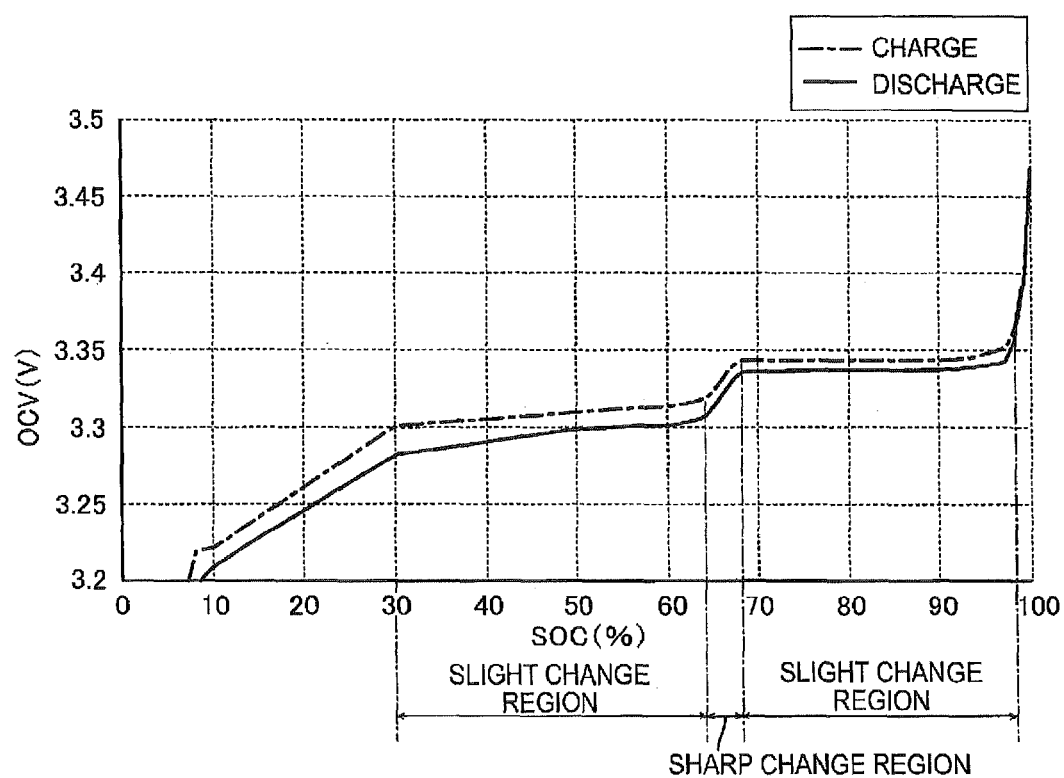
FIG. 2 is a graph illustrating a correlation between an OCV and an SOC.
Figure 3:
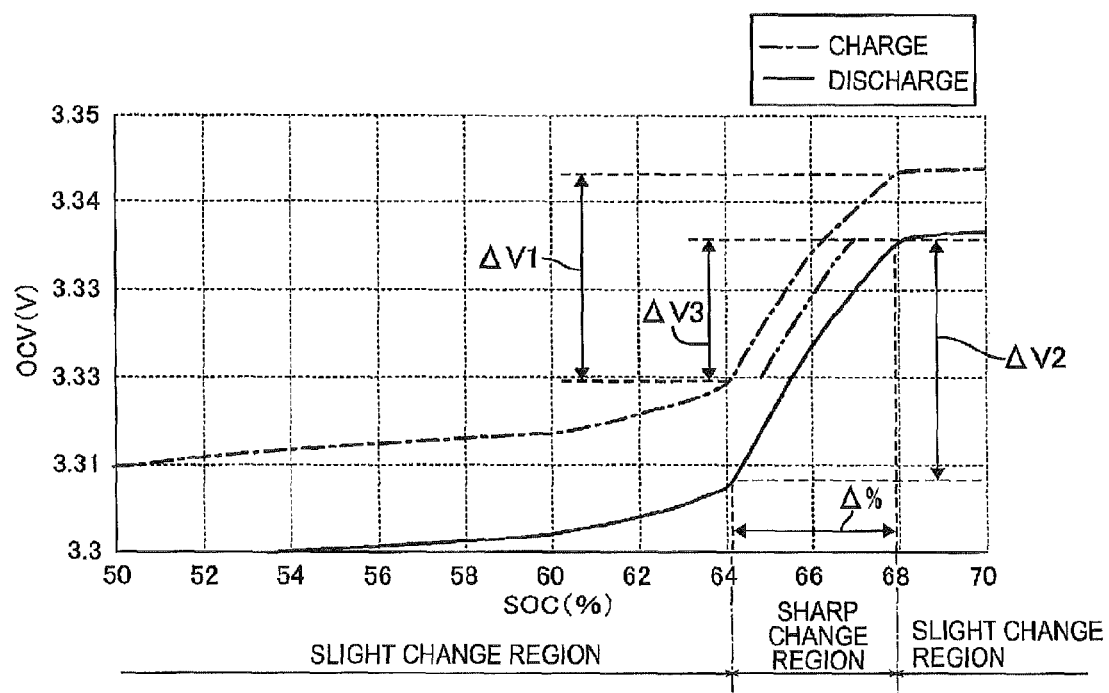
FIG. 3 is a partial magnified view of the graph illustrating the correlation between OCV and SOC.

FIG. 2 illustrates an OCV-SOC curve of the iron phosphate lithium ion battery. FIG. 3 illustrates a part of the OCV-SOC curve in a magnified view. The OCV-SOC curve provides information on a correlation between OCV and SOC regarding the assembled battery 2. The OCV-SOC curve provides information on correlation between OCV and SOC of the assembled battery 2. The OCV-SOC curve may be predefined based on specifications of the assembled battery 2 or specific experiments.

The correlation between OCV and SOC of the assembled battery 2 may vary depending on the state of the assembled battery 2, that is, whether the assembled battery 2 is in the charge state or the discharge state. In FIGS. 2 and 3, chain lines indicate OCV-SOC curves in the charge state, and solid lines indicate OCV-SOC curves in the discharge state. If an SOC is estimated based on a defined OCV using the OCV-SOC curve in the discharge state although the state of the assembled battery 2 before the OCV is defined is the charge state, the estimated SOC might be significantly different from an actual SOC depending on the defined OCV. If an SOC is estimated based on a defined OCV using the OCV-SOC curve in the charge state although the state of the assembled battery 2 before the OCV is defined is the discharge state, the estimated SOC might be significantly different from an actual SOC depending on the defined OCV.

The OCV is not limited to the voltage across the assembled battery 2 in non-current flowing condition. For example, the voltage across the assembled battery 2 may be measured if a condition that a voltage variation of the assembled battery 2 per unit time is equal to or lower than a predetermined amount although a small current such as a dark current may flow therethrough is satisfied. The graphs illustrated in FIGS. 2 and 3 are drawn based on OCVs defined while the above condition is satisfied. The predetermined amount may be defined based on specifications of the assembled battery 2 or certain experiments.

In general, in an OCV-SOC curve of a battery including a negative electrode made of graphite material, large slight change regions, in which a variation in OCV per unit SOC is significantly small, exist. The variation in OCV per unit SOC is hereinafter referred to as an OCV variation. For example, in the OCV-SOC curve illustrated in FIG. 2, the OCV variation is substantially zero in a region in which the SOC is from about 30% to about 64% and a region in which the SOC is from about 68% to about 98%. Namely, those regions are flat regions and considered as the slight change regions in which the OCV variation is equal to or smaller than a reference value. The reference value can be defined as appropriate. For example, the OCV variation in a region other than the slight change region and the sharp change region, which will be described later, may be defined as the reference value. Such a region may be where the SOC is from about 0% to about 30%. In FIG. 2, the OCV variation in such a region is 0.81 mV/%. Alternatively, the reference value may be defined by multiplying the above OCV variation by an integer (preferably two or larger). The reference value is preferably equal to or smaller than 5 mV/%.

In the estimation of the SOC based on the defined OCV using the slight change region of the OCV-SOC curve, if a measurement error of the voltage sensor 34 is ±5 mV, the determined SOC may have a margin of error of ±15%. Namely, it is difficult to accurately estimate the SOC based on the defined OCV in the slight change region. Therefore, it is not preferable to shift the SOC estimated by the SOC estimation method using the current integration to the SOC estimated based on the defined OCV.

In an OCV-SOC curve of the battery including a negative electrode made of graphite material, a sharp change region, in which the OCV variation is large relative to the slight change region, exists between two slight change regions. In other words, the sharp change region is a region between two inflection points. The inflection points are points at which the OCV variation changes equal to or larger than a predetermined value. In FIG. 2, a region in which the SOC is from about 64% to about 68% is a slope region in which the OCV variation is large and a sharp change region in which the OCV variation is larger than the reference value. The reason why the region in which the SOC is from about 64% to 68% is the sharp change region may be because a staging configuration of the negative electrode made of the graphite material changes in this regions.

In the sharp change region, the SOC can be accurately estimated based on the defined OCV in comparison to the slight change region because the OCV variation is relatively large. Therefore, it is preferable to obtain an SOC based on the defined OCV if the defined OCV is in the sharp change region and to shift the SOC estimated by the SOC estimation method using the current integration to the SOC estimated based on the defined OCV. The OCV in the sharp change region is preferably within the rated voltage range of the assembled battery 2, that is, a range from 3.2V to 3.5V, more preferably, from 3.3V to 3.35V. With this configuration, the SOC estimated by the SOC estimation method using the current integration can be shifted to the SOC estimated based on the defined OCV within the normal condition of the assembled battery 2.

In FIG. 3, $\Delta V1$ indicates an OCV range in the sharp change region in the charge state, $\Delta V2$ indicates an OCV range in the sharp change region in the discharge state, $\Delta V3$ indicates an OCV range in an overlapping region of the above OCV ranges $\Delta V1$ and $\Delta V2$. Furthermore, $\Delta$ % indicates an SOC range in the sharp change region. The region in which the OCV is within the OCV range $\Delta V3$ and the SOC is within the SOC range $\Delta$ % may be referred to as an overlapping region hereinafter. As illustrated in FIG. 3, the OCV-SOC curve in the charge state and the OCV-SOC curve in the discharge state in the overlapping region are substantially parallel to each other. Furthermore, a difference in SOC between the charge state and the discharge state for the same OCV is significantly small in comparison to regions other than the overlapping region. The memory 36 only stores correlation data that indicates correlation between OCV and SOC within a region between the OCV-SOC curve in the charge state and the OCV-SOC curve in the discharge state. For example, the correlation data that indicates correlation between the OCVs in the OCV range $\Delta V3$ and center values of the SOCs in the discharge state and the SOCs in the charge state.

Battery Management Process

The control unit 31 is operable with power supplied by the assemble battery 2 regardless of on-off conditions of an engine of the hybrid vehicle, for example. The control unit 31 repeatedly executes a battery management process illustrated in FIG. 4.

In the battery management process, the CPU 35 starts an SOC integration step for estimating an SOC by the SOC estimation method using the current integration (S1). The CPU 35 repeats the SOC integration step for every predetermined time. Specifically, the CPU 35 integrates the current value I by time based on the detection signal SG1 from the current sensor 33. The CPU 35 multiplies the calculated value of the current value I by charging efficiency of the assembled battery 2, divides the multiplied value by the total amount of charge of the assembled battery 2, and multiplies the divided value by 100. The CPU 35 determines the value calculated as above as a current integrated SOC (%). The CPU 35 calculates an SOC by adding the current integrated SOC to a predetermined initial SOC and determines the calculated SOC as a current estimated SOC.

Examples of methods for determining initial SOCs include the following method performed by the CPU 35. The method includes detecting a voltage value V that is a voltage across the assembled battery 2 at the start of the BMS 3 based on the detection signal SG2 from the voltage sensor 34. The method further includes determining an SOC corresponding to the voltage value V based on the OCV-SOC correlation data stored in the memory 36 if the voltage value V is within the OCV range $\Delta V3$ and defining the determined SOC as an initial SOC. Another example may be a method performed by the CPU 35 including storing an estimated SOC that is the estimated SOC immediately before the BMS 3 is stopped if the voltage value V is out of the OCV range $\Delta V3$ and defining the estimated SOC stored in the memory 36 as an initial SOC.

After the SOC integration process is started, the CPU 35 determines whether an OCV detection condition is satisfied (S2). If the OCV detection condition is satisfied (YES in S2), the CPU 35 executes a voltage measurement step for defining the current OCV (S3). In this embodiment, the OCV detection condition is a condition in which the current value I of the charging/discharging current of the assembled battery 2 remains equal to or smaller than the reference current value for a predetermined period. The reference current value is a current value 0(A) that is measured in the no-load condition or a current value higher than the current value 0(A) by a predetermined current value. For example, the OCV detection condition may be satisfied when an electric component such as car audio is in use while the hybrid vehicle is parked.

If the current value I is equal to or smaller than the reference current value, the CPU 35 starts counting an elapsed time since the time when the current value I is equal to or smaller than the reference current value. The CPU 35 also starts storing the voltage values V based on the detection signals SG2 from the voltage sensor 34. If the condition in which the current value I is equal to or smaller than the reference current value continues for a predetermined period, the CPU 35 determines that the OCV detection condition is satisfied (YES in step S2). Then, the CPU 35 defines the voltage value V immediately before the time at which the current value I exceeds the reference current value as the current OCV (S3). Another example of the OCV detection condition is a condition in which the hybrid vehicle remains stopped for a predetermined period at a red light.

After the current OCV is detected, the CPU 35 executes an OCV determination step for determining whether the detected OCV is within the overlapping region (S4). If the detected OCV is within the overlapping region (YES in step S4), the CPU 35 can accurately estimate the SOC based on the detected OCV because the detected OCV is within the sharp change region. As described earlier, the OCV-SOC curve in the charge state and the OCV-SOC curve in the discharge state are substantially parallel to each other in the overlapping region. Furthermore, the difference between the SOC in the charge state and the SOC in the discharge state for the same OCV is small in the overlapping region.

If the defined OCV is within the overlapping region (YES in step S4), the CPU 35 executes SOC adjustment steps (S5, S6). The SOC adjustment steps are steps for adjusting the estimated SOC obtained through the SOC integration process based on the SOC corresponding to the defined OCV. Specifically, the CPU 35 extracts an SOC corresponding to the defined OCV from the OCV-SOC correlation data stored in the memory 36 regardless of the current state, that is, whether the charge state or the discharge state (S5). Then, the CPU 35 shifts the estimated SOC obtained in the SOC integration step to the extracted SOC (S6). With these steps, an integration error included in the estimated SOC determined in the SOC integration step can be reduced without determining whether the current state is the charge state or the discharge state.

The CPU 35 starts the SOC integration step for the current value I of the charge/discharge current that flows after the SOC is shifted. The CPU 35 multiplies the integrated value of the current value I since the SOC is shifted by the charge efficiency of the assembled battery 2, divides the multiplied value by the total amount of charge of the assembled battery 2, and multiplies the divided value by 100. The CPU 35 defines the calculated value as the current integrated SOC (%). The CPU 35 adds the current integrated SOC to the SOC extracted in step S5 and determined the added value as the current estimated SOC. The CPU 35 proceeds to step S7 when the SOC adjustment steps are complete.

If the detected OCV is out of the overlapping region (NO in step S4), the detected OCV is more likely to be in the slight change region. If so, as described earlier, the CPU 35 is less likely to accurately estimate the SOC based on the detected OCV. Therefore, the CPU 35 proceeds to step S7 without executing the SOC adjustment steps, that is, prohibits the SOC adjustment steps, or the determining of the SOC corresponding to the defined OCV as an estimated SOC. In step S7, the CPU 35 executes a degradation determination based on the estimated SOC. Specifically, the CPU 35 determines that the assembled battery 2 is not degraded if the estimated SOC is within the predetermined reference range. If the estimated SOC is out of the reference range, the CPU 35 determines that the assembled battery 2 is degraded. In this case, the CPU 35 sends information on SOC or errors to external devices such as an engine control unit and the charger 40. When the degradation determination step is complete, the CPU 35 returns to step S2.

Charge Control Process

The control unit 31 is operable with the power supplied by the assembled battery 2. The control unit 31 repeatedly executes a charge control process illustrated in FIG. 5.

Specifically, the CPU 35 executes a charge enable condition determination step for determining whether the condition of the charger 40 satisfies a charge enable condition (S11). The charge enable condition is a condition in which the charger 40 can charge the assembled battery 2. The charge enable condition may be the engine of the hybrid vehicle or the alternator 41 is in operation.

If the engine is in operation, for example, the CPU 35 determines that the condition of the charger 40 satisfies the charge enable condition (YES in step S11) and executes SOC maintaining steps (S12 to S15). Through the SOC maintaining steps, the charger 40 executes charging for maintaining the current estimated SOC in the battery management process equal to or higher than the minimum SOC in the sharp change region. Specifically, the CPU 35 determines whether the current estimated SOC is lower than the first threshold (S12). The first threshold is set to a value equal to or higher than the minimum SOC in the sharp change region (about 64% in FIG. 2). Alternatively, the first threshold is set to a value equal to or higher than the maximum SOC in the sharp change region (about 67% in FIG. 2).

If the current estimated SOC is lower than the first threshold (YES in step S12), the CPU 35 sends a charge priority instruction signal to a charge controller 42 in the charger 40 (S13) and returns to step S11. The charge controller 42 increases a power output level of the alternator 41. Through this step, the charging of the assembled battery 2 by the alternator 41 is prioritized to discharging of the assembled battery 2. As a result, the SOC of the assembled battery 2 is increased equal to or higher than the first threshold.

If the current estimated SOC is equal to or higher than the first threshold (NO in step S12), the CPU 35 determines whether the current estimated SOC is higher than the second threshold (S14). The second threshold is set to a value equal to or higher than the minimum SOC in the sharp change region and higher than the first threshold. Preferably, the second threshold is equal to or lower than 90%, more preferably, equal to or lower than 80%. Namely, the second threshold is preferably lower than 100%. This is to protect the assembled battery 2 from being overcharged due to regenerated power.

If the current estimated SOC is higher than the second threshold (YES in step S14), the CPU 35 sends a discharge priority instruction signal to a charge controller 42 in the charger 40 (S15) and returns to step S11. The charge controller 42 decreases the power output level of the alternator 41. Through this step, the discharging of the assembled battery 2 is prioritized to the charging of the assembled battery 2 by the alternator 41. As a result, the SOC of the assembled battery 2 is decreased equal to or lower than the second threshold.

If the current estimated SOC is equal to or lower than the second threshold (NO in step S14), the CPU 35 returns to step S11 without sending the charge priority instruction signal or the discharge priority instruction signal. The charge controller 42 increases or decreases the power output level of the alternator 41 with own control function. While the charge enable condition is satisfied, the control unit 31 executes feedback control to maintain the current estimated SOC between the first threshold and the second threshold. The CPU 35 may be configured to return to step S11 without executing steps S14 and S15 if the current estimated SOC is equal to or higher than the first threshold (NO in step S12).

If the hybrid vehicle is stopped and the engine thereof is stopped, for example, the CPU 35 determines that the condition of the charger 40 does not satisfy the charge enable condition (NO in step S11) and does not execute the SOC maintaining process. From this point, the assembled battery 2 is in the discharge state due to dark currents or for other reasons.

If the CPU 35 is configured such that the SOC maintaining process is not executed even if the condition of the charger 40 satisfies a charge enable condition (YES in step S11), the SOC of the assembled battery 2 may have already reached the minimum value in the sharp change region at the time the engine is stopped. If so, the SOC of the assembled battery 2 does not pass through the sharp change region while decreasing along the OCV-SOC curve in the discharge state after the engine is stopped. Therefore, the SOC is not shifted and the battery pack 1 is left as it is although a difference exists between the estimated SOC and the actual SOC. In this case, if the engine is restarted and the CPU 35 determines that the charge enable condition is satisfied (YES in step S11) again, the CPU 35 is preferably configured such that the charger 40 forcibly charges the assembled battery 2 until the SOC becomes equal to or higher than the minimum value in the sharp change region so that the SOC can be shifted.

In this embodiment, the CPU 35 executes the SOC maintaining process if the condition of the charger 40 satisfies a charge enable condition (YES in step S11). Therefore, the current estimated SOC is maintained equal to or higher than the minimum SOC in the sharp change region because the above charge control process is executed immediately before the engine is stopped. Namely, the SOC of the assembled battery 2 passes through the sharp change region while decreasing along the OCV-SOC curve in the discharge state after the engine is stopped. Therefore, a situation in which the SOC is not shifted and the battery pack 1 is left as it is although a difference exists between the estimated SOC and the actual SOC is less likely to occur. Furthermore, unlike the case in which the CPU 35 is configured such that the charger 40 forcibly charges the assembled battery 2 if the condition of the charger 40 satisfies the charge enable condition (YES in step S11), the SOC is accurately estimated without additional control.

Effects

In the correlation between OCV and SOC of the assembled battery 2, the slight change regions and the sharp change region exist. In each slight change region, the OCV variation relative to the SOC is equal to or lower than the reference value. In the sharp change region, the OCV variation is higher than the reference value. According to this embodiment, the SOC that corresponds to the detected OCV is selected based on the OCV-SOC correlation data if the detected OCV is within the sharp change region and the estimated SOC determined through the SOC integration step is shifted to the selected SOC. Therefore, the difference between the estimated SOC and the actual SOC is less likely to be increased after the SOC is shifted in comparison to the configuration in which the SOC is shifted to the SOC corresponding to the defined OCV in the correlation between OCV and SOC even if the detected OCV is within the slight change region.

Other Embodiments

The present invention is not limited to the embodiments described above and illustrated in the drawings. The following embodiments are also included in the technical scope of the present invention.

The battery pack 1 of the above embodiment is installed in the electric vehicle or the hybrid vehicle. However, the scope of the present invention can be applied to battery packs installed in conventional engine driven vehicles as power supplies for engine starter motors or auxiliary batteries.

In the above embodiment, the assembled battery 2 is used as an example of an electric storage device or a secondary battery. However, the scope of the present invention can be applied to a battery including a single cell or a battery other than the secondary battery. The scope of the present invention can be applied to any electric storage devices as long as at least one slight change region and at least one sharp change region exist in the correlation between OCV and SOC. The slight change region is a region in which the OCV variation is equal to or smaller than the reference value and the sharp change region is a region in which the OCV variation is larger tan the reference value.

Furthermore, it is preferable to configure the electric storage device such that two slight change regions exit and a sharp change region exits between the slight change regions. The slight change region is a region in which the OCV variation is equal to or smaller than the reference value and the sharp change region is a region in which the OCV variation is larger tan the reference value. It is further preferable to configure the electric storage device such that a plurality of sharp change regions exist between respective slight change regions. With this configuration, the SOCs can be accurately estimated based on the OCVs in many regions. Therefore, determination of an SOC obtained by the method of estimating an SOC using an OCV as an estimated SOC even though the obtained SOC is significantly different from an actual SOC can be effectively suppressed.

The OCV in the sharp change region is preferably within the rated voltage range of the assembled battery 2, that is, a range from 3.2V to 3.5V, more preferably, from 3.3V to 3.35V. A method of producing such an electric storage device is disclosed in published patent application JP-A-2007-250299. A positive electrode may be produced with a positive electrode active material mixed thereto or without the positive electrode active material.

The positive electrode active material is not limited to an iron phosphate material. Another kind of complex oxide such as a manganese phosphate and a cobalt phosphate can be used. The positive electrode active material is not limited to a phosphate material. A positive electrode active material may be made of a material that does not contain phosphate such as a lithium cobalt oxide. For example, in the above embodiment, a potential at the negative electrode made of graphite (open circuit potential, OCP) varies stepwise around 60% SOC and thus the sharp change region appears. Therefore, the kind of the positive electrode is not limited to a specific kind.

In the above embodiment, the control unit 31 including a single CPU and a memory is used as an example of a controller. However, the configuration of the controller is not limited to such a configuration. The controller may include multiple CPUs or a hardware circuit such as an application specific integrated circuit (ASIC). The controller may include both hardware circuit and CPU. For example, at least two of the SOC integration process, the voltage measurement step, the OCV determination step, and the SOC adjustment steps may be executed by a different CPU or a hardware circuit. The sequence of the process and the steps can be altered as appropriate.

In the above embodiment, the memory 36 included in the control unit 31 is used as an example of a memory. However, the memory is not limited to such a memory. For example, the memory may be arranged outside the control unit 31. A medium on which various programs are stored may be a non-volatile memory other than the RAM, such as a CD-ROM, a hard disk device, and a flash memory.

In the above embodiment, the determination of the voltage value V measured in the condition close to the no-load condition as the current OCV is described as an example of the voltage measurement step to define an OCV. However, the voltage measurement step is not limited to such determination, for example, a current OCV may be calculated based on a measured voltage and a parameter. For example, the current OCV may be calculated based on a resistance calculated in advance from a voltage value V and a current value I of the assembled battery 2. With this configuration, the current OCV can be defined regardless of whether or not the assembled battery 2 is in the condition close to the no-load condition. Namely, any one of various known OCV defining methods can be used.

In the above embodiment, the memory 36 stores the correlation data that indicates the correlation between the OCV in the OCV range $\Delta V3$ and the center value of the SOC in the discharge state and the SOC in the charge state corresponding to the OCV. However, the memory 36 may store correlation data that indicates correlation between the OCV in the OCV range $\Delta V3$ and a value in a range between the SOC in the discharge state and the SOC in the charge state corresponding to the OCV other than the center value. However, the SOCs can be determined with substantially same accuracy in the charge state and the discharge state with the configuration of the above embodiment.

The memory 36 may store data on correlation between OCV and SOC in the sharp charge region in the charge state and data on correlation between OCV and SOC in the sharp charge region in the discharge state. In this case, a preferable configuration of the control unit 31 is as follows. The control unit 31 determines whether the assembled battery 2 is currently in the charge state or the discharge state based on a direction of the charge/discharge current or an instruction signal from the charger 40. If the assembled battery 2 is in the charge state, the control unit 31 uses the OCV-SOC correlation data in the charge state. If the assembled battery 2 is in the discharge state, the control unit 31 uses the OCV-SOC correlation data in the discharge state. However, the determination on whether the assembled battery 2 is in the charge state or the discharge state is not required in the configuration of the above embodiment. Namely, the OCV-SOC correlation data in the charge state and the OCV-SOC correlation data in the discharge state are not stored in the memory 36. Therefore, used space on the memory 36 can be reduced.

The control unit 31 may be configured to an SOC of each cell C of the assembled battery 2. In this case, the control unit 31 uses an OCV-SOC curve of the cell C. The control unit 31 may be configured to divide the OCV of the assembled battery 2 by the number of cells C included in the assembled battery 2 and to determine the value obtained by the division as an OCV of a single cell. The BMS 3 may include a voltage sensor configured to individually measure voltages of the cells C and the control unit may be configured to calculate the maximal voltage or an average voltage of the cells C and to determine an OCV of a single cell based on the calculated voltage.

In the overlapping region, the OCV-SOC curve in the charge state and the OCV-SOC curve in the discharge state are substantially parallel to each other as described earlier. Therefore, the difference in SOC between the charge state and the discharge state for the same OCV is constant. In comparison to a configuration in which the OCV-SOC correlation data in the charge state and the OCV-SOC correlation are stored in the memory 36, the used space on the memory 36 can be reduce with the configuration in which the data on such a difference and only one of the OCV-SOC correlation data in the charge state and the OCV-SOC correlation data in the discharge state are stored in the memory 36.

In the above embodiment, the current value I of the charge/discharge current that flows through the assembled battery 2 is used as an example of a variation of the electric storage device other than the OCV. However, the variation is not limited to the current value I. For example, the variation may be a voltage or a current at a startup of the engine in the engine-driven vehicle, a temperature of the electric storage device, or a length of time for which the electric storage device is in use. Such a value may be obtained and the SOC may be estimated based on the value.

In a case that the assembled battery 2 is charged by an external charger or a solar panel while the engine is being stopped, the control unit 31 may be configured to control the charger 40 to execute charge operation for maintaining the current estimated SOC equal to or lower than the maximum SOC in the sharp change region while the engine is running. In the process illustrated in FIG. 5, the first threshold and the second threshold are equal to or lower than the maximum SOC in the sharp change region or equal to or lower than the minimum SOC in the sharp change region.

The SOC passes through the sharp change region while increasing along the OCV-SOC curve in the charge state after the engine is stopped and thus the CPU 35 can shift the SOC. If the SOC of the assembled battery 2 is already increased higher than the maximum SOC in the sharp change region when the engine is stopped and the SOC does not pass through the sharp change region while increasing along the OCV-SOC curve in the charge state, the SOC is not shifted. The battery pack 1 is left as it is although a difference exists between the estimated SOC and the actual SOC even if the difference between the estimated SOC and the actual SOC is present. However, the current estimated SOC is maintained equal to or lower than the maximum SOC in the sharp change region in this embodiment. Therefore, such a problem is less likely to occur. Namely, the OCV-SOC curve in the charge state always passes the sharp change region when the assembled battery 2 is charged by the external charger after the engine is stopped. Therefore, the SOC is accurately estimated through the SOC adjustment steps without additional control such as forced charging or discharging.

The control unit 31 may be configured to control the charger 40 to maintain the current estimated SOC equal to or higher than the minimum SOC in the sharp change region and equal to or lower than the maximum SOC in the sharp change region. The OCV is not limited to the voltage across the assembled battery 2 in the condition in which no current flows. For example, the OCV may be a voltage across the assembled battery 2 measured in a condition that a voltage variation of the assembled battery 2 per unit time is equal to or smaller than a defined value although a small current such as a dark current flows.

The control unit 31 may be configured to perform step S2 without performing the SOC integration step (S1) in the battery management process, to extract the SOC corresponding to the defined OCV (S5) if the defined OCV is within the overlapping region (YES in step S4), to determine the extracted SOC as an estimated SOC instead of shifting the SOC (S6), and then to perform step S7.

Figure 4:
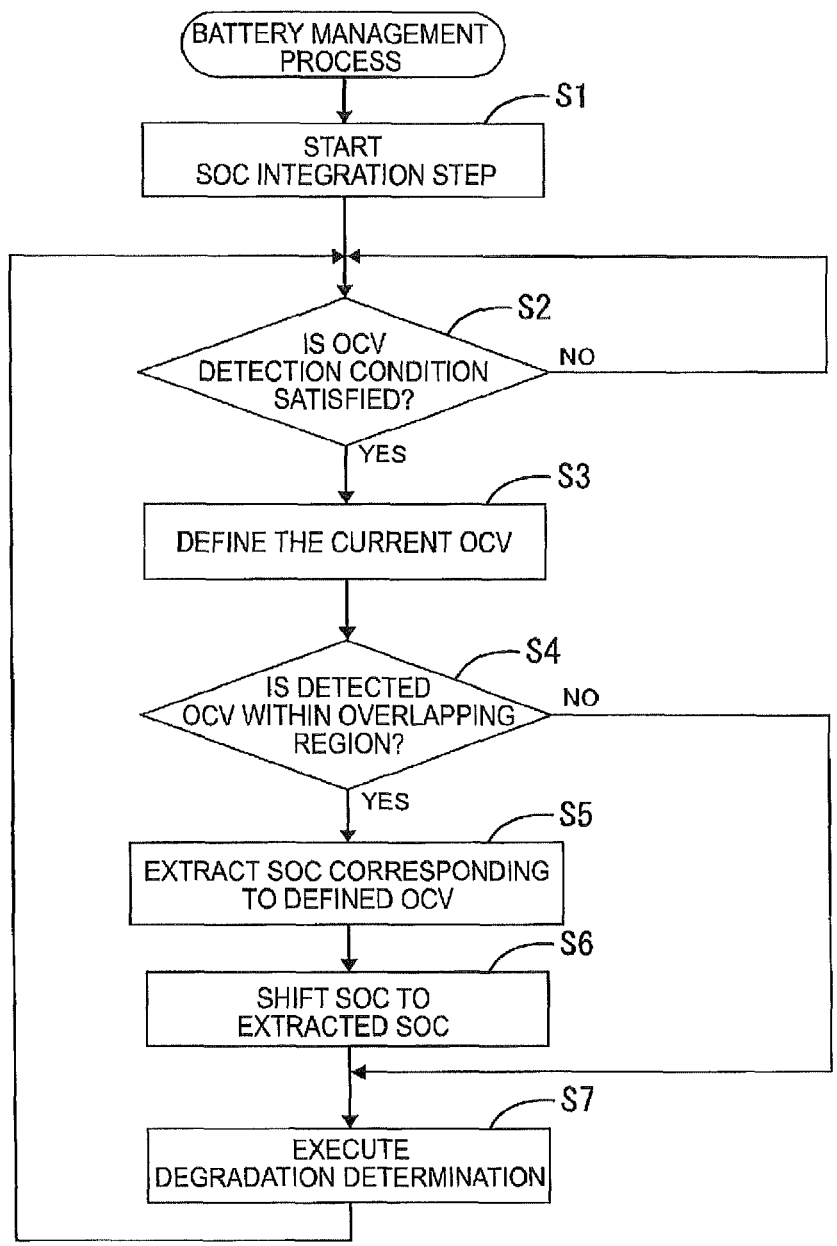
FIG. 4 is a flowchart illustrating a battery management process.
Figure 5:
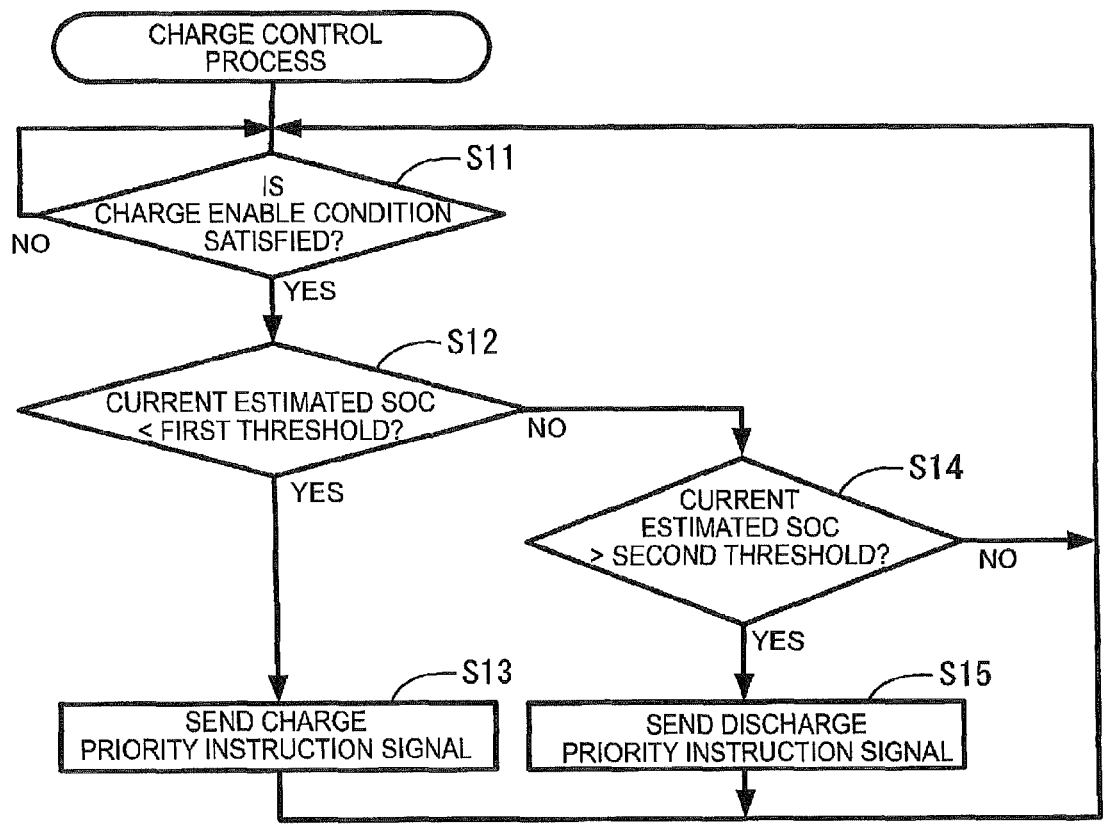
FIG. 5 is a flowchart illustrating a charging control process.

How to prohibit the determining of the SOC corresponding to the defined OCV as an estimated SOC if the defined OCV is out of the overlapping region (NO in step S4) is not limited to the prohibiting of the SOC adjustment steps as illustrated in FIG. 4. In FIG. 4, the control unit 31 does not extract the SOC corresponding to the defined OCV if the defined OCV is out of the overlapping region. However, the control unit 31 may be configured to extract the SOC corresponding to the defined OCV but not to determine the extracted SOC as an estimated SOC.

What is claimed is:

1. An electric storage device management system, comprising:
   a voltage sensor configured to detect a voltage across an electric storage device having a correlation between an open circuit voltage (OCV) and a state of charge (SOC), the correlation including a slight change region and a sharp change region, the slight change region being a region in which a variation in OCV relative to the SOC is equal to or smaller than a reference value, and the sharp change region being a region in which the variation is larger than the reference value;
   a memory storing information on correlation between OCV and SOC in the sharp change region; and
   a controller which executes:

defining an OCV of the electric storage device;
determining whether the defined OCV is within the sharp change region; and
if the defined OCV is within the sharp change region, then performing an SOC adjustment which includes determining an SOC corresponding to the defined OCV based on the information stored in the memory, and determining the determined SOC corresponding to the defined OCV as an estimated SOC.

2. The electric storage device management system according to claim 1, wherein the controller defines the OCV of the electric storage device based on a detection signal generated by the voltage sensor.

3. The electric storage device management system according to claim 1, wherein the controller executes the following:
if the defined OCV is out of the sharp change region, then not performing the SOC adjustment.

4. The electric storage device management system according to claim 1, wherein the correlation includes another slight change region in which the variation in OCV relative to the SOC is equal to or smaller than a reference value, and
the sharp change region exists between the slight change regions.

5. The electric storage device management system according to claim 1, further comprising a current sensor configured to detect a current flowing through the electric storage device.

6. The electric storage device management system according to claim 5, wherein before the defining of the OCV of the electric storage device, the controller executes the following:
estimating an SOC by integrating the current detected by the current sensor by time.

7. The electric storage device management system according to claim 5, wherein the controller defines the OCV of the electric storage device if a voltage variation of the electric storage device per unit time is equal to or lower than a predetermined amount while a small current flows through the electric storage device.

8. The electric storage device management system according to claim 1, wherein the controller causes the electric storage device to maintain the estimated SOC equal to or lower than the SOC in the sharp change region, and then detects that the defined OCV is within the sharp change region when the electric storage device is charged.

9. The electric storage device management system according to claim 1, wherein the controller causes the electric storage device to maintain the estimated SOC equal to or higher than the SOC in the sharp change region, and then detects that the defined OCV is within the sharp change region when the electric storage device is discharged.

10. The electric storage device management system according to claim 1, wherein the controller performs the SOC adjustment in an overlapping region in which a range of OCV in the sharp change region when the electric storage device is charged and a range of OCV in the sharp change region when the electric storage device is discharged overlap.

11. A electric storage device pack comprising:
an electric storage device; and
the electric storage device management system according to claim 1.

12. A method of estimating a state of charge (SOC) of an electric storage device having a correlation between an open circuit voltage (OCV) relative to a state of charge (SOC), which includes a slight change region and a sharp change region, the slight change region being a region in which a variation in OCV relative to the SOC is equal to or smaller than a reference value, and the sharp change region being a region in which the variation is larger than the reference value, the method comprising:
defining an OCV of the electric storage device;
determining whether the defined OCV is within the sharp change region; and
if the defined OCV is within the sharp change region, then performing an SOC adjustment which includes determining an SOC corresponding to the defined OCV based on information stored in a memory and determining the determined SOC corresponding to the defined OCV as an estimated SOC.

13. A solar panel system, comprising:
a solar panel;
an electric storage device charged by the solar panel, the electric storage device having a correlation between an open circuit voltage (OCV) and a state of charge (SOC), the correlation including a slight change region and a sharp change region, the slight change region being a region in which a variation in OCV relative to the SOC is equal to or smaller than a reference value, and the sharp change region being a region in which the variation is larger than the reference value; and
an electric storage device management system, comprising:
a voltage sensor configured to detect a voltage across the electric storage device;
a memory storing information on correlation between OCV and SOC in the sharp change region; and
a controller which executes:
defining an OCV of the electric storage device;
determining whether the defined OCV is within the sharp change region; and
if the defined OCV is within the sharp change region, then performing an SOC adjustment which includes determining an SOC corresponding to the defined OCV based on the information stored in the memory, and determining the determined SOC corresponding to the defined OCV as an estimated SOC.

14. The solar panel system according to claim 13, wherein the controller causes the electric storage device to maintain the estimated SOC equal to or lower than the SOC in the sharp change region, and then detects that the defined OCV is within the sharp change region when the electric storage device is charged.

15. The solar panel system according to claim 13, wherein the controller causes the electric storage device to maintain the estimated SOC equal to or higher than the SOC in the sharp change region, and then detects that the defined OCV is within the sharp change region when the electric storage device is discharged.

* * * * *